(12) United States Patent
Gaerditz et al.

(10) Patent No.: US 8,927,325 B2
(45) Date of Patent: Jan. 6, 2015

(54) METHOD FOR PRODUCING AN ORGANIC RADIATION-EMITTING COMPONENT AND ORGANIC RADIATION-EMITTING COMPONENT

(75) Inventors: Christoph Gaerditz, Regensburg (DE); Ralph Paetzold, Roth (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 12 days.

(21) Appl. No.: 13/062,449

(22) PCT Filed: Aug. 10, 2009

(86) PCT No.: PCT/DE2009/001139
§ 371 (c)(1),
(2), (4) Date: May 23, 2011

(87) PCT Pub. No.: WO2010/025696
PCT Pub. Date: Mar. 11, 2010

(65) Prior Publication Data
US 2011/0266588 A1 Nov. 3, 2011

(30) Foreign Application Priority Data
Sep. 4, 2008 (DE) .......................... 10 2008 045 948

(51) Int. Cl.
*H01L 21/00* (2006.01)
(52) U.S. Cl.
USPC ............................................ 438/99; 257/40
(58) Field of Classification Search
USPC ........................................ 438/99, 22; 257/40
See application file for complete search history.

(56) References Cited

U.S. PATENT DOCUMENTS

| 2004/0232830 | A1 | 11/2004 | Hieda | |
| 2006/0017375 | A1 | 1/2006 | Noguchi et al. | |
| 2007/0015294 | A1* | 1/2007 | Horng et al. | 438/3 |
| 2007/0273276 | A1 | 11/2007 | Ottermann et al. | |
| 2009/0166615 | A1* | 7/2009 | Nakata et al. | 257/40 |

FOREIGN PATENT DOCUMENTS

| CN | 1795571 | 6/2006 | |
| DE | 10324880 | 1/2005 | |
| EP | 1887628 A1 * | 2/2008 | ............. H01L 27/32 |
| JP | 10-012377 | 1/1998 | |
| JP | 11-339970 | 12/1999 | |

(Continued)

OTHER PUBLICATIONS

"On." Merriam-Webster.com. 2013. http://www.merriam-webster.com (Apr. 18, 2013).*

*Primary Examiner* — Reema Patel
(74) *Attorney, Agent, or Firm* — Cozen O'Connor (57) ABSTRACT

A method for producing an organic radiation-emitting component is specified, which comprises, in particular, the following method steps: A) providing a first electrode layer (2) on a substrate (1), B) applying a structured electrically conductive layer (3) on the first electrode layer (2), wherein the electrically conductive layer (3) comprises a metal, C) producing an electrically insulating layer (4) comprising an oxide of the metal of the electrically conductive layer (3) on surfaces (31) of the electrically conductive layer (3) which are remote from the first electrode layer (2) by oxidation of the metal, D) applying at least one organic functional layer (5) on the first electrode layer (2) and the electrically insulating layer (4), and E) applying a second electrode layer (9) on the at least one organic functional layer (5). An organic radiation-emitting component is furthermore specified.

18 Claims, 3 Drawing Sheets

(56) References Cited

FOREIGN PATENT DOCUMENTS

| | | |
|---|---|---|
| JP | 2004-134282 | 4/2004 |
| JP | 2004-349138 | 12/2004 |
| TW | 200535516 | 11/2005 |
| TW | 200746886 | 12/2007 |
| WO | WO 2005/106573 | 11/2005 |
| WO | WO 2008/051530 | 11/2005 |
| WO | WO 2007/029756 | 3/2007 |

* cited by examiner

METHOD FOR PRODUCING AN ORGANIC RADIATION-EMITTING COMPONENT AND ORGANIC RADIATION-EMITTING COMPONENT

RELATED APPLICATIONS

This is a U.S. national stage of application No. PCT/DE2009/001139, filed on Aug. 10, 2009.

This patent application claims the priority of German Patent Application 10 2008 045 948.8 filed Sep. 4, 2008, the disclosure content of which is hereby incorporated by reference.

FIELD OF THE INVENTION

A method for producing an organic radiation-emitting component, and an organic radiation-emitting component are specified.

BACKGROUND OF THE INVENTION

One desirable property of large-area organic light-emitting diodes (OLEDs) for lighting purposes is the homogeneity of the luminance over the active, light-emitting area. A conventional OLED usually has two electrode layers, between which are arranged organic layers for the generation and emission of light. On account of the small layer thicknesses and/or materials usually used, the electrode layers of the OLED have a relatively high electrical resistance, which brings about a relatively low transverse conductivity along the extension direction or plane of the electrode layers, at high current densities a voltage drop arises along the extension direction or plane, which voltage drop can lead to a considerable inhomogeneity of the luminance. This is undesirable, however, especially in the case of lighting applications requiring a large and homogeneous luminous area.

SUMMARY OF THE INVENTION

It is an object of at least one embodiment to specify a method for producing an organic radiation-emitting component comprising at least one organic functional layer. Furthermore, it is an object of at least one embodiment to specify an organic radiation-emitting component comprising at least one organic functional layer.

In accordance with one embodiment, a method for producing an organic radiation-emitting component comprises, in particular, the following method steps:
A) providing a first electrode layer on a substrate,
B) applying a structured electrically conductive layer on the first electrode layer, wherein the electrically conductive layer comprises a metal,
C) producing an electrically insulating layer comprising an oxide of the metal of the electrically conductive layer on surfaces of the electrically conductive layer which are remote from the first electrode layer by oxidation of the metal,
D) applying at least one organic functional layer on the first electrode layer and the electrically insulating layer, and
E) applying a second electrode layer on the at least one organic functional layer.

In accordance with a further embodiment, an organic radiation-emitting component comprises, in particular,
a first electrode layer on a substrate,
a structured electrically conductive layer comprising a metal on the first electrode layer,
an electrically insulating layer comprising an oxide of the metal of the structured electrically conductive layer, which is arranged on a surface of the electrically conductive layer which is remote from the first electrode layer,
at least one organic functional layer arranged on the first electrode layer and the electrically insulating layer and
a second electrode layer arranged on the at least one organic functional layer.

All features, further embodiments and advantages that are described in the following relate equally to the abovementioned method and to the abovementioned organic radiation-emitting component.

Thereby, the fact that one layer or one element is arranged or applied "on" or "above" another layer or another element can mean here and hereinafter that said one layer or one element is arranged directly in direct mechanical and/or electrical contact on the other layer or the other element. Furthermore, it can also mean that said one layer or one element is arranged indirectly on or above the other layer or the other element. In this case, further layers and/or elements can then be arranged between said one and the other layers or between said one and the other elements.

The fact that one layer or one element is arranged "between" two other layers or elements can mean here and hereinafter that said one layer or one element is arranged directly in direct mechanical and/or electrical contact or in indirect contact with one of the two other layers or elements and in direct mechanical and/or electrical contact or in indirect contact with the other of the two other layers or elements. Thereby, in the case of indirect contact, further layers and/or elements can then be arranged between said one and at least one of the two other layers or between said one and at least one of the two other elements.

The at least one organic functional layer can, as is described further below, be suitable for generating and emitting electromagnetic radiation during the operation of the organic radiation-emitting component. The designations "radiation", "electromagnetic radiation" and "light" denote here and hereinafter electromagnetic radiation having at least one wavelength or one spectral component in an infrared to ultraviolet wavelength range. In particular, infrared, visible and/or ultraviolet light can be designated.

The structured electrically conductive layer on the first electrode layer can make it possible to reduce the electrical resistance of the first electrode layer along the extension direction and/or plane of the first electrode layer. As a result, the method described here can be used to produce an organic radiation-emitting component which, in comparison with an OLED without an electrically conductive layer, enables a greater homogeneity of the current density in the first electrode layer and therefore also in the at least one organic functional layer. What can thereby be achieved is that the homogeneity of the luminance of the electromagnetic radiation generated in the at least one organic functional layer is also improved in comparison with conventional OLEDs.

Furthermore, it is possible to provide an organic radiation-emitting component in which the structured electrically conductive layer, although in direct electrical contact with the first electrode layer, is not in direct electrical contact with the at least one organic functional layer. That can be achieved by the electrically insulating layer being produced on a surface of the electrically conductive layer which is arranged remote from the first electrode layer. In particular, the surface of the electrically conductive layer on which the electrically insulating layer is produced can comprise at least all the surfaces of the electrically conductive layer which are remote from the first electrode layer and which adjoin the at least one organic functional layer. What can thereby be achieved is that the electrically conductive layer is not in direct electrical contact with the at least one organic functional layer after method steps C) and D) have been carried out.

Furthermore, the surface of the electrically conductive layer on which the electrically insulating layer is produced can comprise all the surfaces of the electrically conductive layer which are remote from the first electrode layer such that the electrically conductive layer is completely enclosed by the first electrode layer and the electrically insulating layer after method step C) has been carried out.

Thereby, the feature that two layers or elements are in "direct electrical contact" can mean here and hereinafter that the two layers or elements directly adjoin one another and have a common interface. In this case, a charge carrier exchange, that is to say an electric current flow, can take place between the two layers or elements via the interface. In the case of the organic radiation-emitting component described here by contrast, the surface of the electrically conductive layer on which the electrically insulating layer is arranged, precisely owing to the electrically insulating layer, is not in direct electrical contact with the organic functional layer since no charge carriers can be exchanged between the electrically conductive layer and the at least one organic functional layer via the surface with the electrically insulating layer.

What can be achieved by the production of the electrically insulating layer on a surface of the electrically conductive layer and preferably at least on all the surfaces of the electrically conductive layer which are remote from the first electrode layer and which directly adjoin the at least one organic functional layer is that the current density in the first electrode layer is homogenized and at the same time, however, a charge carrier exchange and thus an electric current flow can take place only between the first electrode layer and the organic functional layer.

This can, for example, prevent the distance—which is smaller in comparison with the distance between the first and second electrode layers—between the structured electrically conductive layer and the second electrode layer from leading to higher electric field strengths in regions between the electrically conductive layer and the second electrode layer during the operation of the organic radiation-emitting component, which would in turn lead to a higher current flow and to increased generation of light in these regions. The electrically insulating layer thus makes it possible to prevent or at least reduce, during the operation of the organic radiation-emitting component, undesirable inhomogeneities in the current density and hence also in the luminance of the organic radiation-emitting component. Moreover, in the absence of an electrically insulating layer, on account of the higher electric field strengths in regions between the electrically conductive layer and the second electrode layer, higher electric currents could occur in these regions, which can result in an accelerated local degradation of the materials of the layers of the component through to a short circuit, which would result in a failure of the entire organic radiation-emitting component. In organic components which couple out light through a bottom, transparent electrode and a transparent substrate, the light emission toward the observer side through the transparent electrode layer and the transparent substrate can be masked by the electrically conductive layer, such that the generation of light in the regions of the electrically conductive layer can lead to losses and therefore be undesirable.

By virtue of the production of the electrically insulating layer on the electrically conductive layer, therefore, a component can be producible or produced in which, during operation, an electrical charge carrier exchange and thus an electric current flow indeed takes place between the first electrode layer and the organic functional layer, but does not take place between the structured electrically conductive layer and the organic functional layer, such that electrical charge carriers on the part of the first electrode layer can pass only from the first electrode layer into the organic functional layer, but not from the electrically conductive layer. As a result, it is possible to achieve a functional separation of the electrically conductive layer and the first electrode layer in such a way that the electrically conductive layer, despite its arrangement between the first electrode layer and the organic functional layer, serves only for homogenizing the current density in the first electrode layer.

The production of the electrically insulating layer by oxidation of the metal of the electrically conductive layer furthermore advantageously makes it possible to ensure that the electrically insulating layer, in method step C), is exclusively produced on the electrically conductive layer and is therefore arranged only on the at least one surface of the electrically conductive layer or else furthermore preferably only on all the surfaces of the electrically conductive layer which are remote from the first electrode layer and which directly adjoin the organic functional layer.

In contrast to the method described here, in the case of previously known methods for electrically insulating an electrically conductive layer, an additional insulation layer is applied by deposition in a further process step. Said additional insulation layer can, for example, be applied by vapor deposition by means of a corresponding mask or be adapted by lithographic patterning to the form of the electrically conductive layer to be insulated. Known methods of this type have the disadvantage, however, that the positioning of the insulation layer has to be effected with high precision and quality. If a known method of this type were employed in connection with the first electrode layer described here and the electrically conductive layer, an overlap of the insulation layer with the first electrode layer, that is to say an excessively wide insulation layer, would lead to an unnecessary and unfavorable reduction of the light-emitting area. An excessively narrow insulation layer, by contrast, would lead to the abovementioned problems such as, for example, the formation of increased electric field strengths in the region of the structured electrically conductive layer at the locations at which the excessively narrow insulation layer does not electrically insulate the electrically conductive layer from the organic functional layer.

By means of the method described here, the surface of the electrically conductive layer itself is passivated and thus converted in such a way that the electrically insulating layer is produced. For this purpose, the metal of the electrically conductive layer is converted into an oxide comprising the metal, also designated hereinafter as the metal oxide of the metal of the electrically conductive layer. This can be effected by the oxidation of the at least one surface or else all the surfaces of the electrically conductive layer which are arranged remote from the first electrode layer. What can thus be made possible by the oxidation in method step C) and the production of the electrically insulating layer is that the electrically conductive layer is passivated, that is to say electrically insulated, with respect to the organic functional layer. In this case, the formation of a uniform electrically insulating layer comprising the metal oxide on all the surfaces of the electrically conductive layer which are remote from the first electrode layer can occur without necessitating an abovementioned additional application process step in a vacuum or by means of time- and cost-intensive lithography techniques in order to apply an additional insulator layer on the electrically conductive layer.

Furthermore, the electrically conductive layer, in method step C), can be oxidized by one or more of the following methods: a plasma treatment, in particular a treatment of the first electrode layer and of the structured electrically conductive layer in an oxygen plasma, a UV ozone treatment, reactive ion etching and/or a wet-chemical treatment. In particular, the oxidation in method step C) can also be effected by a combination of these methods or by employing two or more of these methods successively.

Furthermore, in method step C), the first electrode layer can be modified with regard to its wetting property for the at least one organic functional layer and/or its electrical work function for electrical charge carriers. That can mean that, by means of the method in method step C) by means of which the surface of the electrically conductive layer is oxidized, likewise and at the same time the first electrode layer is modified in such a way that the abovementioned properties are improved. Furthermore, it can be possible to clean the first electrode layer by means of method step C) simultaneously with the oxidation of the surface of the electrically conductive layer, for example in order to remove organic residues and impurities from the first electrode layer before method step D). In this context, it was ascertained in the case of the method described here that the cleaning and the improvement or even the optimization of the work function and of the wetting property of the first electrode layer can be carried out in one and the same method step C) as the oxidation of the surface of the electrically conductive layer. Consequently, in the case of the method described here, the integration of these effects in the same method step is possible. Therefore, in the method described here, for an improvement or optimization of the abovementioned properties of the first electrode layer, an additional process step can be dispensed with.

As a result of the oxidation, the incorporation of oxygen atoms into the crystal lattice of the metal of the electrically conductive layer with formation of the metal oxide can occur. Depending on the method conditions during method step C), in this case the metal oxide can be formed in a substantially sharply delimited thickness range of the surface of the electrically conductive layer. That can mean that the metal oxide is present in said thickness range completely or at least predominantly in a stochiometric ratio of the metal atoms and the oxygen atoms and can be characterized in the form of metal oxide layers or layer regions. Furthermore, depending on the method conditions in method step C), the oxygen content can decrease starting from a specific depth in the electrically insulating layer. This decrease in the oxygen content can take place, for example, exponentially, or virtually exponentially. As a result, the transition between the electrically conductive layer and the electrically insulating layer can be continuous without the formation of a sharp interface between the electrically conductive layer and the electrically insulating layer occurring. In this case, the boundary between the electrically insulating layer and the electrically conductively layer can be, for example, that region in the electrically conductive layer and/or the electrically insulating layer in which the content of the oxygen atoms has decreased to $1/e$ or $(1/e)^2$ of the stochiometric oxygen content of the metal oxide, where e designates the Euler number.

The structured electrically conductive layer can be applied with a first thickness, for example, in method step B). As a result of the oxidation of the metal at the at least one surface of the electrically conductive layer which is remote from the first electrode layer in method step C) and the associated production of the electrically insulating layer, the total thickness of the electrically conductive layer and the electrically insulating layer in this region, as a result of the incorporation of oxygen atoms into the metal with formation of the metal oxide, can be greater than the first thickness of the electrically conductive layer after method step B). Furthermore, after method step C) the thickness of the remaining electrically conductive layer can be less than the first thickness of the originally applied electrically conductive layer after method step B).

In method step B) a base metal can be applied as metal of the electrically conductive layer, said base metal being oxidizable at least by means of one of the methods mentioned above. In particular, a metal whose oxide is electrically insulating is applied in method step B). By way of example, the metal can comprise or consist of titanium, magnesium, zirconium and/or aluminum. Therefore, the electrically insulating layer, after method step C), can comprise or consist of titanium oxide, magnesium oxide, zirconium oxide and/or aluminum oxide. In this case, it should be pointed out that the metal oxides described here and hereinafter in principle designate electrically insulating oxides of a metal and hence oxides comprising metals having corresponding oxidation numbers, even if, for example, still other electrically conductive oxides of a stated metal should be known in the case of certain oxidation numbers of the metal.

Particularly preferably, in method step B), aluminum is applied as electrically conductively on the first electrode layer. While aluminum in air under standard conditions forms a thin oxide layer on all surfaces, method step B) can be carried out with exclusion of oxygen for example in a vacuum or in an inert gas atmosphere, such that, in method step C), the electrically insulating layer is producible with a desired thickness by means of one of the abovementioned oxidation methods in a targeted manner.

Thereby, aluminum, in particular, can have a so-called self-passivation effect, which can mean that the oxidation stops automatically in the case of a certain thickness, which can be set by means of the method parameters, for example.

The substrate with the electrically conductive layer and thereabove with the electrically insulating layer can, after method step C), also be further processable and/or storable outside the inert gas atmosphere, without the electrically conductive layer being damaged by harmful influences such as, for instance, moisture and/or oxygen.

In this case, the thickness of the electrically insulating layer producible in method step C) and comprising the metal oxide can have at least the thickness of a monolayer of the metal oxide. Particularly preferably, the thickness of the electrically insulating layer can be greater than or equal to 5 nanometers in order to enable a sufficient electrical insulation of the electrically conductive layer. Furthermore it can be advantageous if the thickness of the electrically insulating layer is less than or equal to 100 nanometers and, in particular, less than or equal to 25 nanometers. The thinner the electrically insulating layer is made, the smaller, too, the total thickness of the electrically conductive layer and the electrically insulating layer, such that, advantageously, no unnecessary optical shading by the electrically conductive layer and the electrically insulating layer is perceptible during the operation of the organic radiation-emitting component.

The thickness of the organic functional layer can furthermore be greater than the total thickness of the electrically conductive layer and the electrically insulating layer together, such that the organic functional layer covers the electrically conductive layer and the electrically insulating layer and planarizes the unevennesses caused thereby on the first electrode layer.

Furthermore, the electrically conductive layer can be applied by sputtering or vaporization in method step B). In this case, the electrically conductive layer can preferably be structured in strip-type fashion in method step B) and comprise one or a plurality of strips or webs. In this case, for example, the electrically conductive layer can be applied in large-area and unstructured fashion on the first electrode layer and subsequently be structured in a strip-type fashion by means of a mask. In this case, regions of the electrically conductive layer applied in large-area fashion can be removed from the first electrode layer by means of known dry- or wet-chemical etching processes, for example also using patterned photoresist masks. Alternatively, the first electrode layer, in method step B), can be applied by vapor deposition or sputtering in a manner such that it is already structured in strip-type fashion by means of a mask.

Furthermore, it is also possible to use a printing method such as screen printing, for instance, or else a spray coating method by means of a mask.

In method step B) the electrically conductive layer can be applied in the form of strips with a width of less than or equal to 100 micrometers and greater than or equal to 100 nanometers. In this case, the individual strips can extend uniformly or in patterns over partial regions or over the entire first electrode layer and be arranged for example in straight or curved fashion and furthermore parallel alongside one another, in star-shaped fashion and/or in reticulated fashion. By way of example, the first electrode layer can have an electrical contact region for electrically connecting the first electrode layer to an external voltage and/or current supply. In this case, strips of the electrically conductive layer can preferably extend away from the electrical contact region.

As an alternative or in addition to the strip-type structuring, the electrically conductive layer, in method step B), can also be structured into a form of some other geometrical form that is suitable for bringing about a homogeneous current density distribution in the first electrode layer and in the at least one organic functional layer.

Furthermore, in method step A), it is possible to provide the substrate with the first electrode layer and a further electrically conductive layer between the substrate and the first electrode layer. By means of the further electrically conductive layer, which can be arranged on that surface of the first electrode layer which faces the substrate, it is possible to further increase the transverse conductivity of the first electrode layer and thus to bring about a further homogenization of the current density in the first electrode layer.

In particular, the organic radiation-emitting component can be embodied as an organic radiation-emitting diode (OLED). For this purpose, the organic radiation-emitting component can have an active region suitable for emitting electromagnetic radiation during operation. The organic radiation-emitting component can have an organic radiation-emitting layer sequence having the first electrode layer, the second electrode layer and, between the latter, an organic layer sequence comprising the at least one organic functional layer. The organic layer sequence can have a plurality of further organic functional layers in addition to at least one organic functional layer. In this case, the at least one organic functional layer or the plurality of the functional layers can, for example, comprise electron transport layers, electroluminescent layers and/or hole transport layers or be embodied as such. The organic layer sequence can comprise the active region in which electromagnetic radiation can be generated by recombination of electrons and holes.

The first and/or the second electrode layer can in each case be embodied in large-area fashion. A large-area emission of the electromagnetic radiation generated in the active region can be made possible as a result. In this case, "large-area" can mean that the organic electronic component has an area of greater than or equal to a few square millimeters, preferably greater than or equal to one square centimeter, and particularly preferably greater than or equal to one square decimeter. Alternatively or additionally, the first and/or the second electrode can be embodied in structured fashion at least in partial regions. As a result, a structured emission of the electromagnet radiation generated in the active region can be made possible, for instance in the form of pixels or pictograms. By virtue of the electrically conductive layer on the first electrode layer, a more uniform and laterally more homogeneous energization of the active region can be made possible than is the case with OLEDs without an electrically conductive layer described here. By virtue of the more uniform and laterally more homogeneous energization, it is possible to achieve a homogeneous luminous area of the organic radiation-emitting component.

By way of example, the substrate can comprise glass, quartz, plastic films, metal, metal films, silicon wafers or some other suitable substrate material. If the organic radiation-emitting component is embodied as a so-called "bottom emitter", that is to say that the electromagnetic radiation generated in the active region is emitted through the substrate, then the substrate can have a transparency for at least part of the first radiation.

In the bottom emitter configuration, the first electrode layer, too, can advantageously have a transparency for at least part of the electromagnetic radiation generated in the active region. A transparent first electrode layer, which can be embodied as an anode and thus serves as hole-injecting material, can, for example, comprise a transparent conductive oxide or consist of a transparent conductive oxide. Transparent conductive oxides ("TCO" for short) are transparent, conductive materials, generally metal oxides, such as, for example, zinc oxide, tin oxide, cadmium oxide, titanium oxide, indium oxide or indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stochiometric composition and can also be p- or n-doped.

The at least one organic functional layer or the plurality thereof can comprise organic polymers, organic oligomers, organic monomers, organic small, non-polymeric molecules ("small molecules"), or combinations thereof. Suitable materials for an OLED are known to the person skilled in the art and will not be explained in any further detail here. Depending on the materials in the functional layers, the electromagnetic radiation generated can have individual wavelengths or ranges or combinations thereof from the ultraviolet to red spectral range.

The second electrode layer can be embodied as a cathode and therefore serve as electron-injecting material. Inter alia, in particular aluminum, barium, indium, silver, gold, magnesium, calcium or lithium and compounds, combinations and alloys thereof can prove to be advantageous as cathode material. Alternatively or additionally, the second electrode layer can also comprise one of the abovementioned TCOs. Additionally or alternatively, the second electrode layer can also be embodied in transparent fashion and/or the first electrode layer can be embodied as a cathode and the second electrode layer as an anode. That means, in particular, that the organic radiation-emitting component can also be embodied as a "top emitter".

Furthermore, the first and/or the second electrode layer can also comprise one or a plurality of organic electrically conductive materials, for instance doped or undoped polyaniline, polypyrrole and/or polythiophene, and/or carbon nanotubes (CNT).

Furthermore, the organic radiation-emitting component can also simultaneously be embodied as a bottom emitter and as a top emitter and have a transparent first electrode layer and a transparent second electrode layer. As a result, the organic radiation-emitting component can be transparent.

BRIEF DESCRIPTION OF THE DRAWINGS

Further advantages, preferred embodiments and developments of the method for producing an organic radiation-emitting component, and of the organic radiation-emitting component will become apparent from the exemplary embodiment explained below and in conjunction with the figures.

In the figures.

DETAILED DESCRIPTION OF THE DRAWINGS

The elements illustrated and their size relationships among one another should not be regarded as true to scale in principle; rather, individual elements such as, for example, layers, structural parts, components and regions may be illustrated with exaggerated thickness or size dimensions in order to enable better illustration and/or in order to afford a better understanding.

Figure 1A:
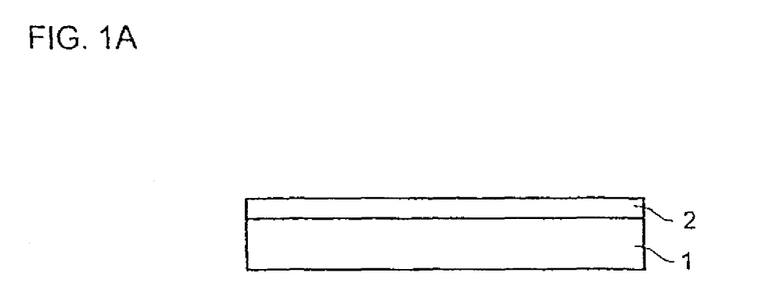
FIGS. 1A to 1E show a method for producing an organic radiation-emitting component, and an organic radiation-emitting component in accordance with one exemplary embodiment.

FIG. 1A shows a first method step A) of a method for producing an organic radiation-emitting component in accordance with one exemplary embodiment. In this case, a substrate 1 with a first electrode layer 2 is provided. In the exemplary embodiment shown, the substrate 1 and the first electrode layer 2 are embodied in transparent fashion. In this case, the substrate 1 is composed of glass and the first electrode layer 2, which is applied on the substrate 1 in large-area fashion, is composed of indium tin oxide (ITO). In the exemplary embodiment shown, the first electrode layer 2 serves as an anode and hence as a hole injection layer.

Alternatively thereto, the substrate 1 and/or the first electrode layer 2 can comprise one or a plurality of the materials described in the general part.

Figure 1B:
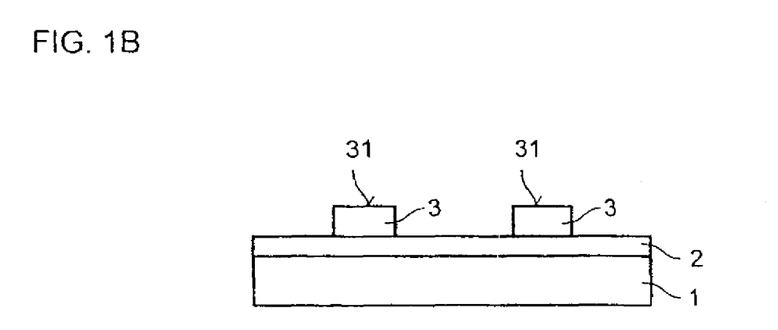
Figure 1B:
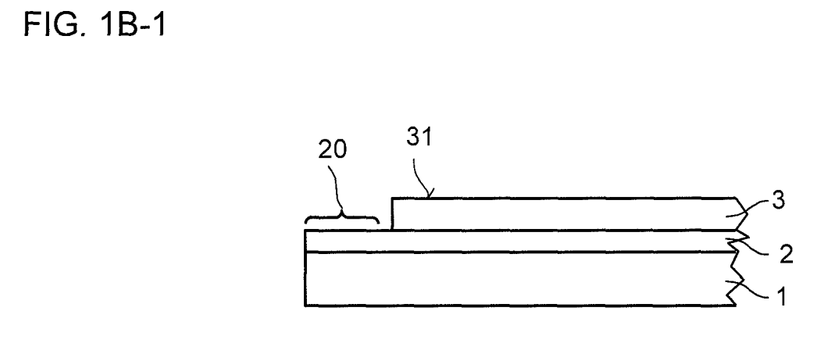

FIG. 1B shows a further method step B), in which a structured electrically conductive layer 3 is applied. In the exemplary embodiment shown, for this purpose aluminum is deposited by means of thermal vaporization through a shadow mask (not shown) on the first electrode layer 2. In this case, the shadow mask is embodied in such a way that the electrically conductive layer 3 forms on the first electrode layer 2 in strips or strip-type regions which extend over the first electrode layer 2 and which are composed of aluminum. As an alternative thereto, one of the further materials mentioned in the general part or a combination thereof can also be applied. In this case, the strips of the electrically conductive layer 3 have a width of a few micrometers. The wider the strips of the electrically conductive layer 3 are made and the smaller the distance between respectively adjacent strips, the better the current density can be homogenized in the first electrode layer 2. The narrower the strips of the first electrode layer 2 and the greater the distance between in each case two adjacent strips, the more light can subsequently be emitted through the first electrode layer 2 and the substrate 1 during the operation of the organic radiation-emitting component.

If the first electrode layer 2 has an electrical contact region for electrical contact-making then it is advantageous if the strip-type regions of the electrically conductive layer 3 extend away from the electrical contact region and thus bring about an effective increase in the transverse conductivity or a reduction of the electrical resistance of the first electrode layer 2. In the later organic radiation-emitting component, this results in a homogenization of the current density in the first electrode layer 2 and thus a homogenization of the luminous impression over the entire area of the first electrode layer 3 or of the active region to be applied in a later method step.

FIG. 1B-1 is a view perpendicular to the view shown in FIGS. 1B. As shown in FIG. 1B-1, the electrically conductive layer 3 is arranged on the first electrode layer 2. The conductive layer 3 is arranged such that the first electrode layer 2 has an electrical contact region 20.

Figure 1C:
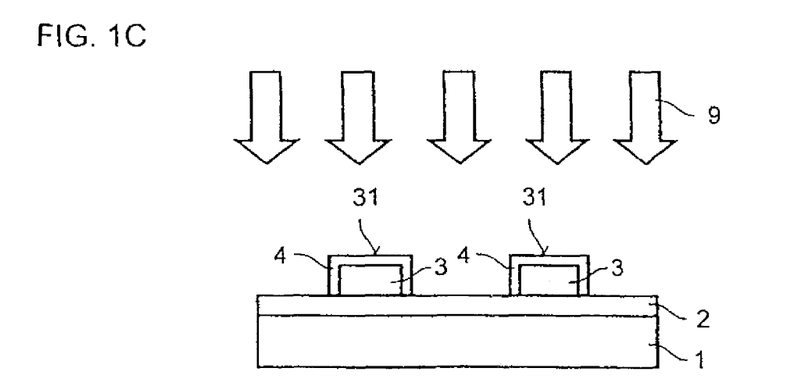

Each strip-type region of the electrically conductive layer 3 has a surface 31 which is remote from the first electrode layer 2 and which is not in direct contact with the first electrode layer 2. In a further method step C), an electrically insulating layer 4 is produced on said surface 31 by means of oxidation 9, as is shown in FIG. 1C. For this purpose, the substrate 1 with the first electrode layer 2 and the structured electrically conductive layer 3 is exposed to an oxygen plasma, which is indicated by the arrows 9.

The oxygen plasma has the effect that the aluminum of the electrically conductive layer 3 is oxidized on the surface 31 and a metal oxide layer, an aluminum oxide layer in the exemplary embodiment shown, is formed as an electrically insulating layer 4 on the surface 31. The electrically insulating layer 4 has a thickness of approximately 5 to 25 nanometers after method step C). As a result of the action of the oxygen plasma or alternatively or additionally of one of the further oxidation methods mentioned in the general part such as, for instance, a UV ozone treatment or a wet-chemical treatment, in the exemplary embodiment shown the entire surface 31 of the electrically conductive layer 3 is oxidized and the electrically insulating layer 4 is produced thereon, such that the electrically conductive layer 3, after the oxidation, is completely enclosed by the electrically insulating layer 4 and the first electrode layer 2. As a result, the electrically conductive layer 3 is exclusively in direct electrical contact with the first electrode layer 2, as a result of which, as is described in the general part, the formation of regions with excessively high electric field strengths in regions near the electrically conductive layer 3 can be avoided, for example, during the operation of the organic radiation-emitting component.

Furthermore, the electrically insulating layer 4, as a result of the oxidation of the surface 31, is produced precisely on the electrically conductive layer 3, but not on the first electrode layer 2. What can thereby advantageously be ensured is that the electrically insulating layer 4 does not unnecessarily cover a region of the first electrode layer 2, which would lead to a reduction of the light power emitted through the first electrode layer 2 and the substrate 1. On the other hand, what can be ensured by the method described here is that the electrically insulating layer 4 is formed on the entire surface 31 of the electrically conductive layer 3.

Furthermore, what is achieved by means of the oxygen plasma is that the wetability of the first electrode layer 2 is increased and the work function for charge carriers from the ITO of the first electrode layer 2 is reduced. Furthermore, the oxygen plasma makes it possible to remove, for example, organic impurities on the first electrode layer 2. Since these effects concerning the first electrode layer 2 can be achieved simultaneously with the oxidation 9 of the electrically conductive layer 2 for the production of the electrically insulating layer 4, an additional corresponding process step is no longer necessary in comparison with known methods for producing OLEDs.

Figure 1D:
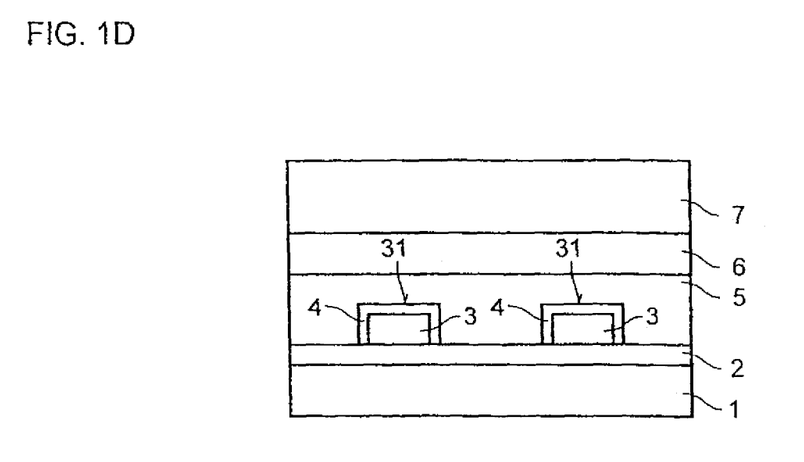

FIG. 1D shows a further method step D), in which an organic functional layer 5 is applied on the electrically insulating layer 4 and the first electrode layer 2. In this case, the organic functional layer 5 is embodied as a hole transport layer and has a thickness that is greater than the total thickness of the electrically conductive layer 3 and the electrically insulating layer 4. The organic functional layer 5 thus completely covers the electrically conductive layer and the electrically insulating layer 4. To put it another way, the electrically conductive layer 3 with the electrically insulating layer 4 thereon projects into the organic functional layer 5. In this case, the electrically insulating layer 4 prevents a direct electrical contact between the electrically conductive layer 3 and the organic functional layer 5, such that injection can be effected into the organic functional layer 5 only via the first electrode layer 2 from the substrate side.

Further organic functional layers are applied on the organic functional layer 5, in which case an emitter layer 6 forming the active region and, thereabove, an electron transport layer 7 are shown purely by way of example in the exemplary embodiment illustrated. Depending on materials, that is to say polymers or organic small molecules, of the organic functional layer 5, 6 and 7, for example further organic functional layers such as, for instance, charge carrier blocking layers or else fewer functional layers can also be applied.

Figure 1E:
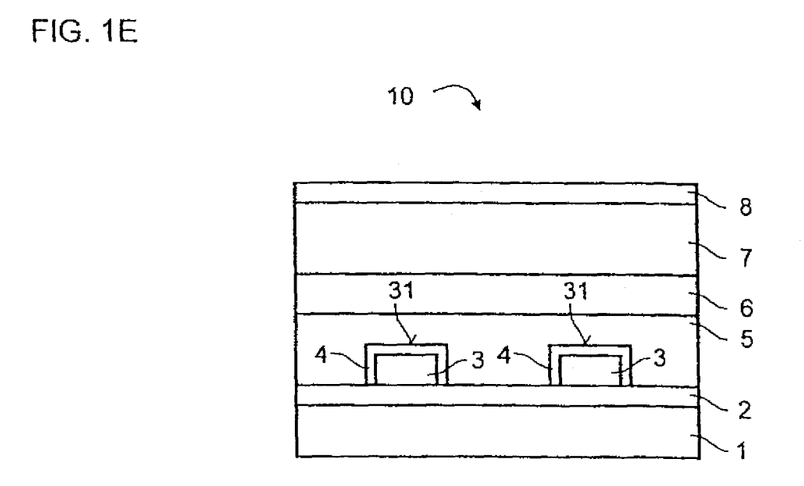

In a further method step E), which is shown in FIG. 1E, a second electrode layer 8 comprising a metal is applied as a cathode and the organic radiation-emitting component 10 is thus completed. In addition, in method step E), by way of example, an encapsulation (not shown) can also be applied above the second electrode layer 8 in order to protect the organic radiation-emitting component 10 against harmful influences such as, for instance, moisture or oxygen.

As an alternative to the exemplary embodiment shown, the first electrode layer 2 can also be embodied as a cathode and the second electrode layer 8 as an anode. In this case, one of the two electrode layers 2, 8 or else both electrode layers can be embodied in transparent fashion. The organic functional layer 5 is then embodied as an electron transport layer, while the organic functional layer 7 is then embodied as a hole transport layer.

The invention is not restricted to the exemplary embodiments by the description on the basis of said exemplary embodiments. Rather, the invention encompasses any novel feature and also any combination of features, which in particular includes any combination of features in the patent claims, even if these features themselves or this combination of features itself are/is not explicitly specified in the patent claims or exemplary embodiments.

The invention claimed is:

1. A method for producing an organic radiation-emitting component, comprising the following method steps:
   A) providing a first electrode layer on a substrate;
   B) applying a structured electrically conductive layer on a surface of the first electrode layer opposite the substrate, wherein the electrically conductive layer comprises a metal with a first surface adjoining the first electrode layer and a second surface remote therefrom;
   C) producing, by oxidation of the metal on said second surface of the electrically conductive layer, an electrically insulating layer comprising an oxide of the metal;
   D) applying at least one organic functional layer (i) to said surface of the first electrode layer opposite the substrate and (ii) to a surface of the electrically insulating layer produced by said oxidation of the metal on said second surface of the electrically conductive layer opposite the substrate; and
   E) applying a second electrode layer on the at least one organic functional layer.

2. The method according to claim 1, wherein in method step C), oxidation is effected by a method or a combination of methods selected from a group formed by an oxygen plasma treatment, a UV ozone treatment, reactive ion etching and a wet-chemical treatment.

3. The method according to claim 1, wherein in method step C), the first electrode layer is modified with regard to its wetting property and/or its electrical work function for charge carriers.

4. The method according to claim 1, wherein in method step B), a base metal is applied as metal of the electrically conductive layer, the oxide of said base metal being electrically insulating.

5. The method according to claim 1, wherein in method step C), the electrically insulating layer is produced with a thickness of greater than or equal to 5 nanometers and less than or equal to 100 nanometers.

6. The method according to claim 1, wherein in method step B), the electrically conductive layer is applied by sputtering or vaporization.

7. The method according to claim 1, wherein in method step B), the electrically conductive layer is structured in strip-type fashion.

8. The method according to claim 7, wherein at least one strip of the electrically conductive layer extends over a partial region of the first electrode layer.

9. The method according to claim 1, wherein in method step B), the electrically conductive layer is structured in strip-type fashion so that strip-type regions of the electrically conductive layer extend away from an electrical contact region to increase a transverse conductivity of the first electrode layer.

10. The method according to claim 1, wherein the electrically insulating layer is formed on exposed lateral surfaces of the electrically conductive layer and the at least one organic functional layer is applied to exposed lateral surfaces of the electrically insulating layer.

11. An organic radiation-emitting component, comprising:
   a first electrode layer on a substrate;
   a structured electrically conductive layer on a surface of the first electrode layer opposite the substrate, wherein the electrically conductive layer comprises a metal with a first surface adjoining the first electrode layer and a second surface remote therefrom;
   an electrically insulating layer comprising an oxide of the metal on said second surface of the electrically conductive layer;
   at least one organic functional layer applied (i) to said surface of the first electrode layer opposite the substrate and (ii) to a surface of the electrically insulating layer which is an oxide of the metal on said second surface of the electrically conductive layer opposite the substrate; and
   a second electrode layer arranged on the at least one organic functional layer.

12. The component according to claim 11, wherein the electrically conductive layer comprises a base metal, the oxide of which is electrically insulating.

13. The component according to claim 12, wherein the electrically insulating layer has a thickness of greater than or equal to 5 nanometers and less than or equal to 100 nanometers.

14. The component according to claim 11, wherein the electrically conductive layer is structured in strip-type fashion.

15. The component according to claim 14, wherein the electrically conductive layer has at least one strip having a width of greater than or equal to 100 nanometers and less than or equal to 100 micrometers.

16. The component according to claim 14, wherein:
   the first electrode layer includes an electrical contact region, and
   strip-type regions of the electrically conductive layer extend away from the electrical contact region to increase a transverse conductivity of the first electrode layer.

17. The component according to claim 11, wherein the electrically insulating layer has a thickness of greater than or equal to 5 nanometers and less than or equal to 100 nanometers.

18. The component according to claim 11, wherein the electrically insulating layer is arranged on exposed lateral surfaces of the electrically conductive layer and the at least one organic functional layer is arranged at exposed lateral surfaces of the electrically insulating layer.

\* \* \* \* \*